US006143606A

United States Patent [19]

Wang et al.

[11] Patent Number: 6,143,606

[45] Date of Patent: Nov. 7, 2000

[54] METHOD FOR MANUFACTURING SPLIT-GATE FLASH MEMORY CELL

[75] Inventors: Ling-Sung Wang, Hsinchu; Ko-Hsing Chang, Taipei, both of Taiwan

[73] Assignee: Worldwide Semiconductor Manufacturing Corp, Hainchu, Taiwan

[21] Appl. No.: 09/061,618

[22] Filed: Apr. 16, 1998

[30] Foreign Application Priority Data

Dec. 26, 1997 [TW] Taiwan ................................ 86119753

[51] Int. Cl.$^7$ ...................... H01L 21/336; H01L 21/4763

[52] U.S. Cl. .......................... 438/257; 438/264; 438/266; 438/593; 257/314; 257/316; 257/319

[58] Field of Search .................................... 438/264, 266, 438/295, 297, 257, 593, 594, 595; 257/314, 315, 319

[56] References Cited

U.S. PATENT DOCUMENTS

| | | | |
|---|---|---|---|
| 5,494,838 | 2/1996 | Chang et al. | 438/257 |
| 5,674,768 | 10/1997 | Chang et al. | 438/257 |
| 5,856,223 | 1/1999 | Wang | 438/264 |
| 5,963,806 | 10/1999 | Sung et al. | 438/266 |

OTHER PUBLICATIONS

K. Naruke et al., "A New Flash–Erase Eeprom Cell with a Sidewall Select–Gate on its Source Side", reprinted from IEDM Tech. Dig., pp. 603–606 (now 183–185), 1989.

Y. Ma et al., "A Novel High Density Contactless Flash Memory Array Using Split–Gte Source–side–injection Cell for 5V–only Applications", 1994 Symposium of VLSI Technology Digest of Technical Papers, pp. 49–50.

*Primary Examiner*—Wael Fahmy
*Assistant Examiner*—William David Coleman
*Attorney, Agent, or Firm*—Jiawei Huang; J.C. Patents

[57] ABSTRACT

In this method for manufacturing a split-gate flash memory cell, a floating gate and a control gate are formed over a substrate, and then first spacers are formed on the sidewalls of the gate structure. Next, a polysilicon layer is deposited over the gate structure and the substrate, and second spacers are formed on the sidewalls of the polysilicon layer. A self-aligned ion implantation process is performed, using the second spacers as a mask, implanting ions into the semiconductor substrate to form a drain region. This maintains the channel length. After removing the second spacers, another ion implantation process is performed to create a source region in the semiconductor substrate. During the second implantation, the polysilicon layer offers some protection for the semiconductor substrate, maintaining the capacity for tunneling. Finally, a conductive layer is formed over the polysilicon layer, and the conductive layer combined with the polysilicon layer forms the select gate.

19 Claims, 4 Drawing Sheets

METHOD FOR MANUFACTURING SPLIT-GATE FLASH MEMORY CELL

CROSS-REFERENCE TO RELATED APPLICATION

This application claims the priority benefit of Taiwan application serial no. 86119753, filed Dec. 26, 1997, the full disclosure of which is incorporated herein by reference.

BACKGROUND OF THE INVENTION

1. Field of Invention

The present invention relates to a manufacturing method for a flash memory cell. More particularly, the present invention relates to a manufacturing method for a split-gate flash memory cell.

2. Description of Related Art

Read only memory (ROM) is a kind of non-volatile memory that can store and retain data even when the power is off. Erasable programmable ROM (EPROM) further expands the application of ROM by introducing the functions of memory erase and rewrite. However, erasing data from an EPROM requires ultraviolet light, and hence packaging cost is comparatively higher. Moreover, memory erase operation will wipe out all the stored data residing inside the EPROM. Therefore, whenever data update is required, every bit of data must be rewritten back to the EPROM, which is rather time-consuming.

Another type of permanent memory that allows changes to a part of the stored data without the need for rewriting everything is the electrically erasable programmable ROM (EEPROM). For EEPROM, data erase and write operations can be conducted in a bit-by-bit fashion. Moreover, data store, read and erase operations can be carried out repeatedly without limitations. A flash memory is an improved version of EEPROM having the same structure as a conventional EEPROM, except that the flash memory is erased block-by-block rather than bit-by-bit. Hence, the speed of operation for a flash memory is exceptionally fast, and a memory erase operation can be finished, for example, within one or two seconds. Because of the time and cost saving benefits, flash memories are now widely used in data storage systems.

In general, the gate of a flash memory cell includes a two-layer structure. One of the layers, known as a floating gate, is a polysilicon layer whose function is to store electric charges. The second layer is known as a control gate and is used to control the storage and retrieval of data. The floating gate is located underneath the control gate, and is in a "floating" state because it is not connected with any other circuit components. On the other hand, the control gate is connected to the word line. There are many articles related to flash memory. For example, Naruke et al. has published an article in Technical Digest of IEEE Electronic Device Meeting, 1988 with the title "A new flash-erase EEPROM cell with a sidewall select-gate on its source side". In the article, an improved flash memory model is described.

FIGS. 1A and 1B are the respective cross-sectional and perspective view of a flash memory cell structure according to the publication by Naruke et al. As shown in FIGS. 1A and 1B, a floating gate 11 and a control gate 12 are formed above a semiconductor substrate 10. A select gate 13 is formed on the side of the floating gate 11 and the control gate 12. The floating gate 11, the control gate 12 and the select gate 13 together constitute a split-gate structure 14. On two sides of the stacked split-gate 14 are ion-doped source region 15 and drain region 16, respectively. The select gate is located on the side of the source region 15, and is formed by an etching back operation. Hence, the select gate 13 is parallel to the control gate 12. The characteristic of this type of flash memory cell is the utilization of select gate 13 to prevent abnormal out-leaking of current, which may result in over-erasing, so that a normal memory operation is maintained. However, because the select gate and the control gate are parallel to each other, problems regarding the design of device may arise. Furthermore, the length of a select gate must be fixed. Therefore, properties of a memory cell are difficult to adjust, and may cause serious interference during data programming.

To resolve the above problems, Y. Ma et al. published an article in VLSI technical conference in 1994 with the title "A novel high density contactless flash memory array using split-gate source-side injection cell for 5V-only application". In the article, another improved flash memory structure is described.

FIG. 2 is a cross-sectional view showing the improved flash memory cell structure according to the publication by Y. Ma et al. As shown in FIG. 2, a floating gate 21, a control gate 22 and a select gate 23 that constitutes a stacked split-gate 24 are formed above a semiconductor substrate 20. On each side of the split-gate 24, ion-doped source region 25 and drain region 26 are formed in the semiconductor substrate 20. The select gate 23 is formed such that it covers the top and the sides of the control gate 22. This type of select gate structure decreases data programming interference problems. However, the level of precision needed in the photolithographic process for forming the select gate 23 is very high, and so a large amount of space is consumed.

In addition, data is stored in an EEPROM by tunneling electrons into the floating gate. During programming, voltages are applied to the control gate and the source/drain regions, and the electrons tunnel through the gate oxide layer to finally end up in the floating gate. Therefore, thickness of the gate oxide layer is critical for the whole tunneling operation. Moreover, the required programming voltages depend very much on the thickness of the gate oxide layer, too. If the gate oxide layer is too thin, too much current may leak out causing a lowering of stability for the memory.

In light of the foregoing, there is a need to provide an improved method of manufacturing split-gate flash memory.

SUMMARY OF THE INVENTION

Accordingly, the present invention is to provide a method for forming a split-gate flash memory cell utilizing a self-aligned process to carry out ion implantation so that one photolithographic processing step is eliminated.

In another aspect, this invention is to provide a method for forming a split-gate flash memory cell such that the source region and the drain region are formed in separate implantation processes. Hence, the ion implantation parameters can be varied accordingly to create the desired properties.

In yet another aspect, this invention is to provide a method for forming a split-gate memory cell with a high quality gate oxide and a constant thickness. In addition, its channel length can be precisely controlled to maintain a good stability for the memory.

To achieve these and other advantages and in accordance with the purpose of the invention, as embodied and broadly described herein, the invention provides a method for manufacturing a split-gate flash memory cell. The method comprises the steps of first providing a semiconductor substrate having a floating gate and a control gate structure already formed thereon. Then, first spacers are formed on the sidewalls of the floating gate and the control gate structure. Next, a polysilicon layer is deposited over the semiconductor substrate and the gate structure. Subsequently, an oxide layer is formed over the polysilicon layer, and then etched back to form second spacers. Using the second spacers as a mask, a first ion implantation is performed with the ions penetrating through the polysilicon layer into the semiconductor substrate to form a drain region. Thereafter, the second spacers are removed and a photoresist layer is formed over the polysilicon layer. Next, the photoresist layer is patterned to expose a portion of the polysilicon layer. Then, a second ion implantation is performed with the ions penetrating through the exposed polysilicon layer into the semiconductor substrate to form a source region. After that, the photoresist layer is removed. Finally, a conductive layer is formed over the polysilicon layer. The conductive layer and the polysilicon layer together constitute a select gate. Hence, the structure of a split-gate flash memory cell is established.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
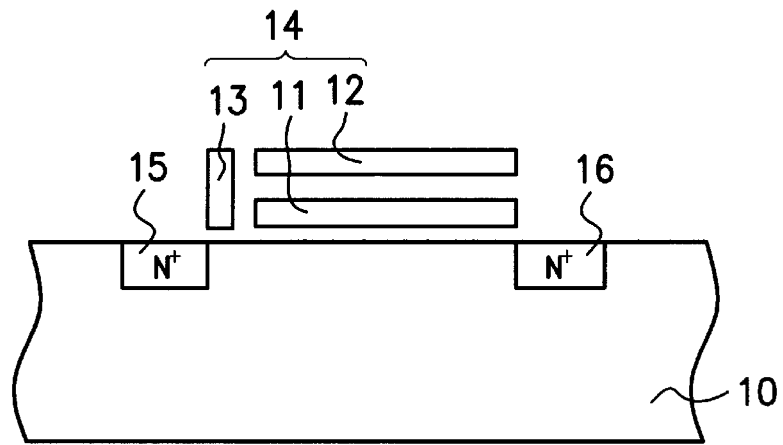
FIGS. 1A and 1B are respective cross-sectional and perspective view of a conventional flash memory cell structure.
Figure 1B:
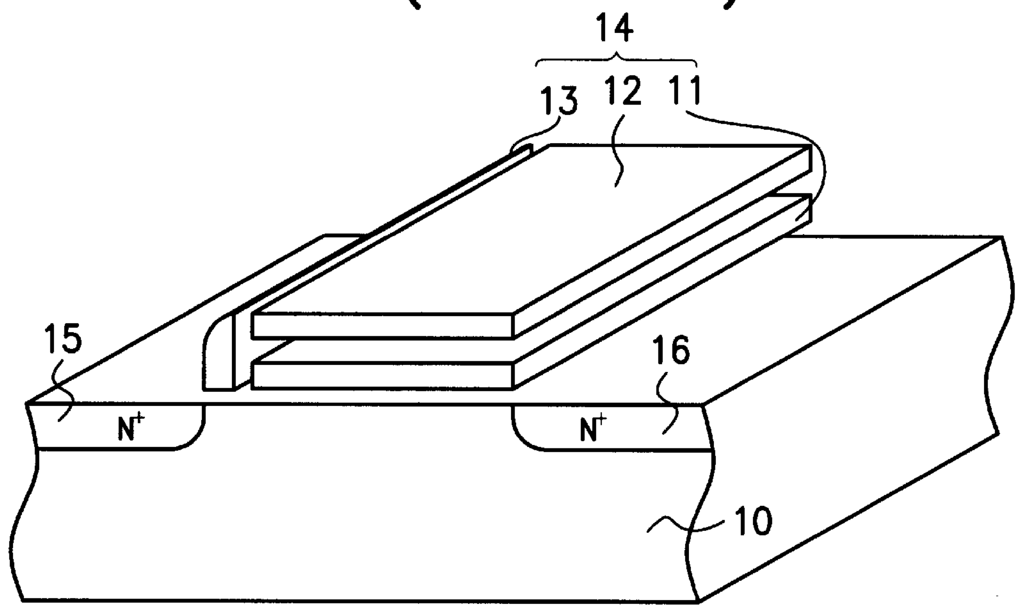
Figure 2:
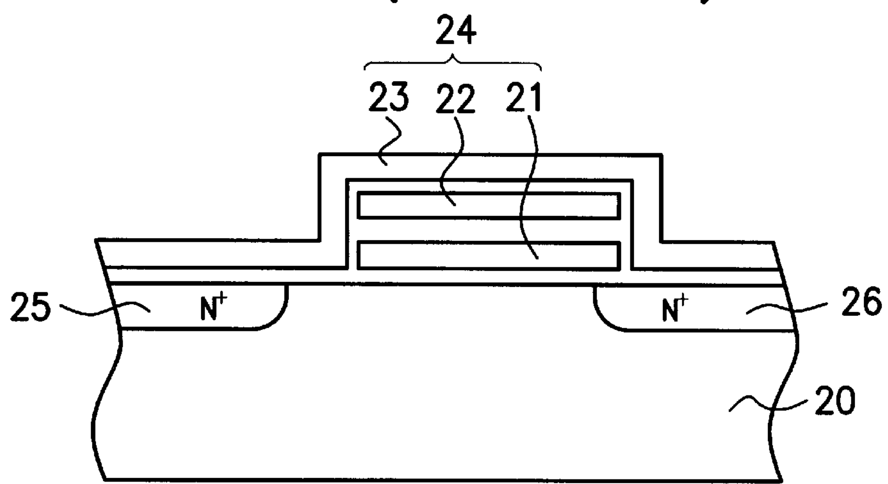
FIG. 2 is a cross-sectional view showing another conventional flash memory cell structure.

Reference will now be made in detail to the present preferred embodiments of the invention, examples of which are illustrated in the accompanying drawings. Wherever possible, the same reference numbers are used in the drawings and the description to refer to the same or like parts.

FIGS. 3A through 3H are cross-sectional views showing the progression of manufacturing steps in forming a flash memory cell structure according to one preferred embodiment of this invention.

Figure 3A:
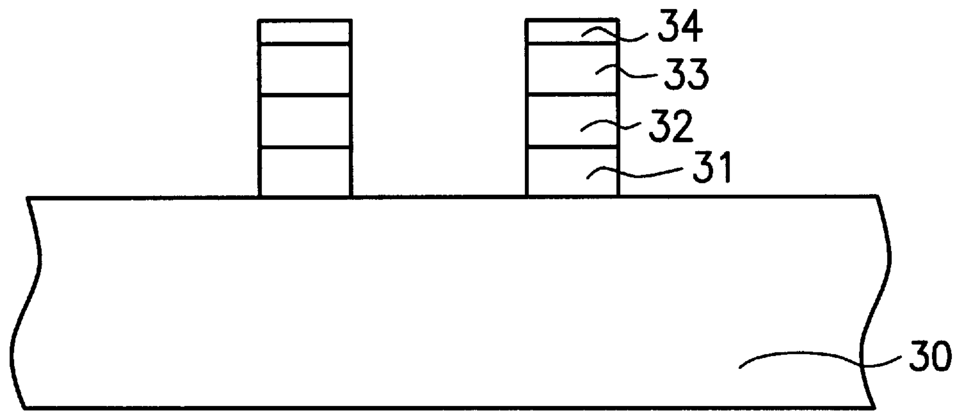
FIGS. 3A through 3H are cross-sectional views showing the progression of manufacturing steps in forming a flash memory cell structure according to one preferred embodiment of this invention.

First, as shown in FIG. 3A, a first conductive layer 31, a dielectric layer 32, a second conductive layer 33 and a silicon nitride layer 34 are sequentially formed over a semiconductor substrate 30, the substrate 30 having a thin gate oxide layer (not shown) already formed on it. Then, the layers are patterned to define a structure as shown in FIG. 3A. The first conductive layer 31 functions as a floating gate, the second conductive layer 33 functions as a control gate, and the dielectric layer 32 is an oxide/nitride/oxide (ONO) composite layer.

Figure 3B:
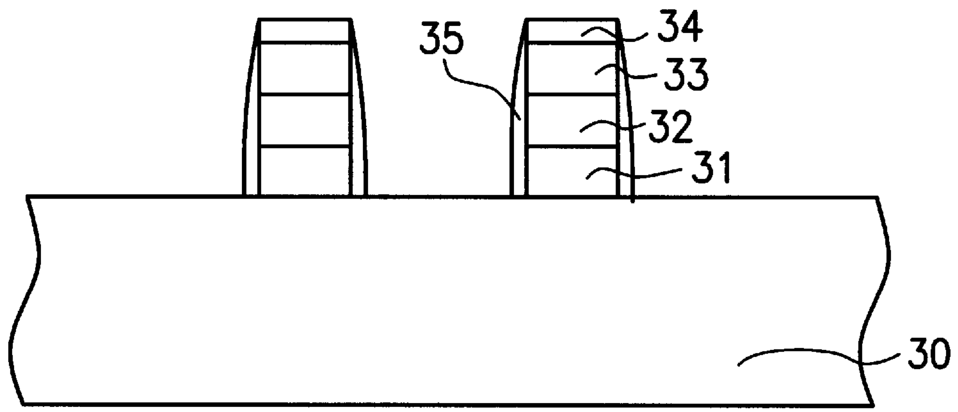
Figure 3C:
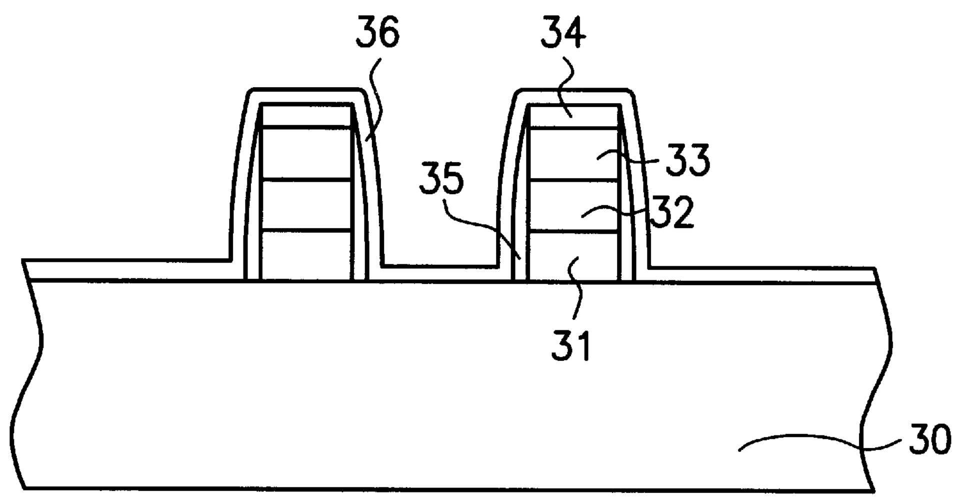

Next, as shown in FIG. 3B, a first oxide layer is formed over the semiconductor substrate 30 and the silicon nitride layer 34, and then the first oxide layer is etched back to form spacers 35 on the sidewalls of the layered structure. Thereafter, a polysilicon layer 36 preferably having a thickness of about 200 Å to 500 Å is formed over the above structure as shown in FIG. 3C.

Figure 3D:
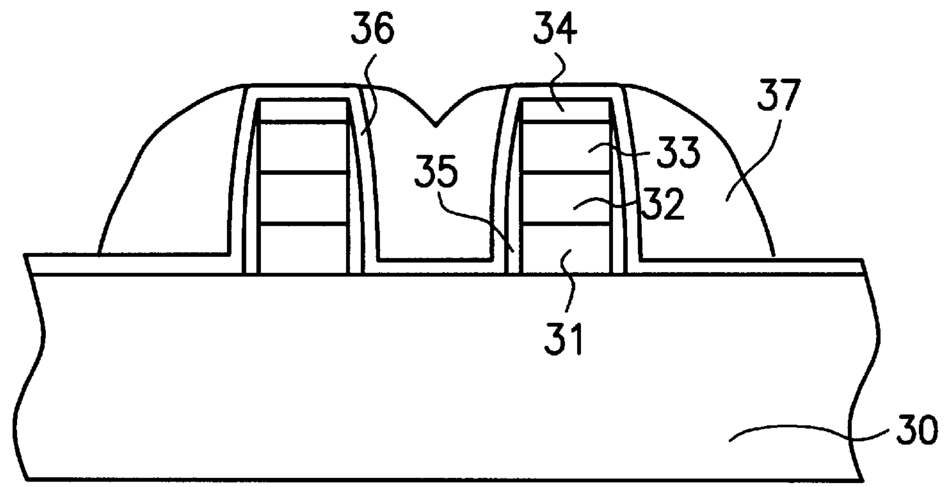

Next, as shown in FIG. 3D, a second oxide layer, preferably having a thickness of about 2000 Å to 4000 Å, is formed over the polysilicon layer 36. The second oxide layer can be formed using, for example, a plasma-enhanced chemical vapor deposition method or by reacting with tetra-ethy-ortho-silicate (TEOS). Subsequently, a portion of the second oxide layer is removed to expose a portion of the polysilicon layer 36, and second spacers 37 are formed on each side of the first polysilicon layer 36. The second oxide layer can be removed using, for example, an etching back operation. Because the second oxide layer is thicker adjacent to the side of the polysilicon layer 36, part of the second oxide layer will not be removed during etching, thereby enabling formation of the spacers 37.

Figure 3E:
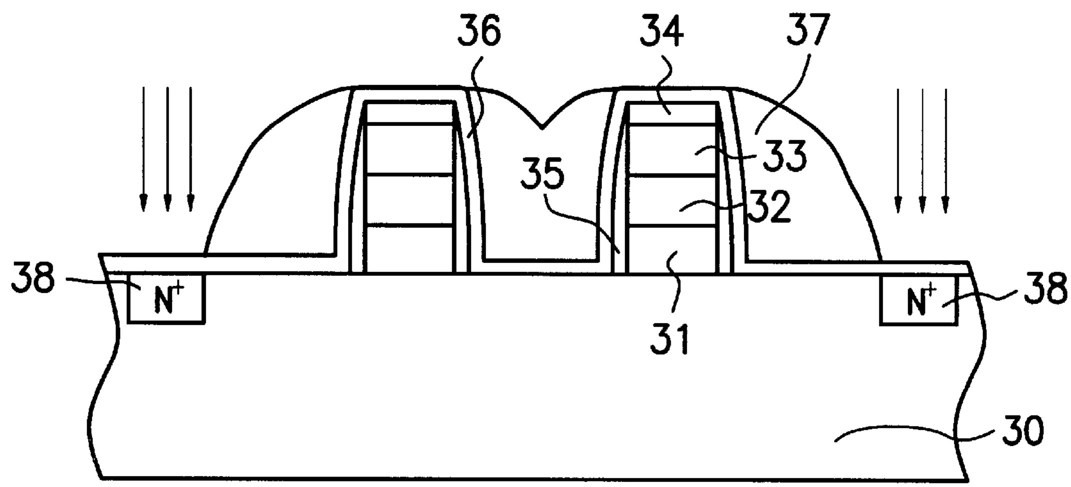
Figure 3F:
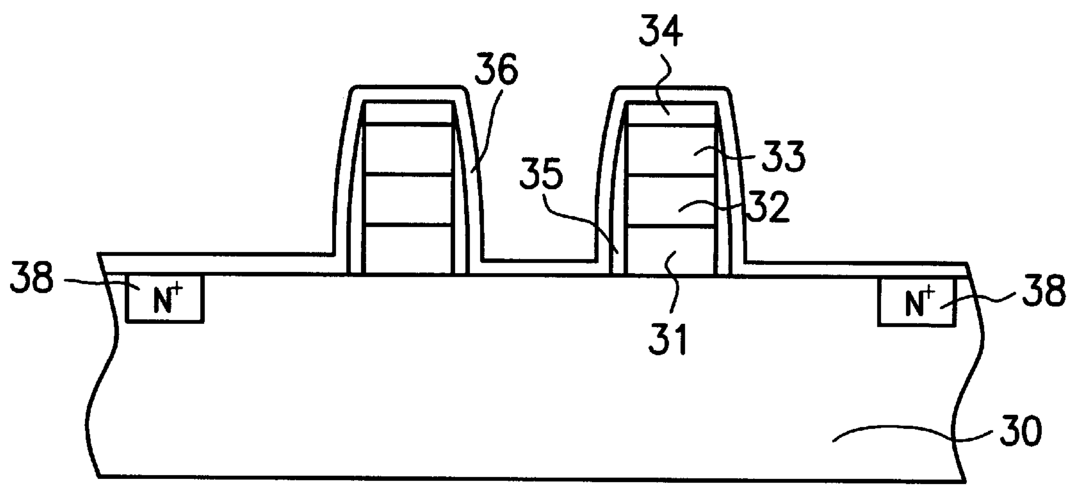

Next, as shown in FIG. 3E, using the second spacers 37 as a mask, a first ion implantation is performed. The ions pass through the polysilicon layer 36, implanting into the semiconductor substrate 30 to form drain regions 38. Thereafter, the second spacers 37 are removed using, for example, a wet etching method to form a structure as shown in FIG. 3F.

Figure 3G:
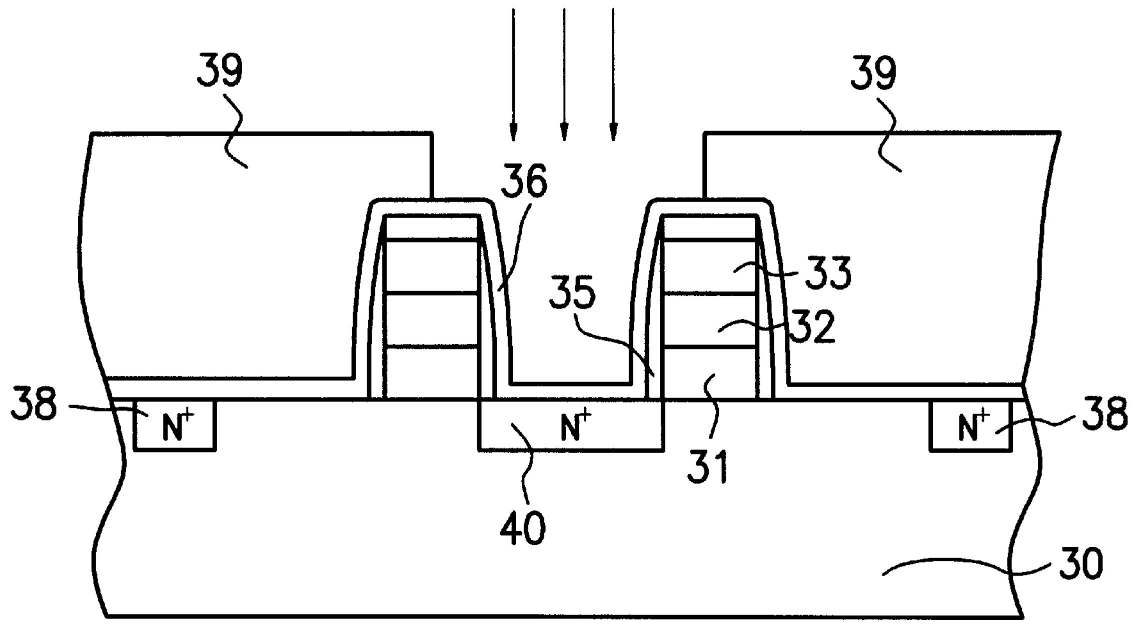

Next, as shown in FIG. 3G, a photoresist layer 39 is coated on top of the polysilicon layer 36, and then patterned to remove a portion of the photoresist layer 39 exposing the desired drain region. In the subsequent step, a second ion implantation is performed to implant ions through the exposed area. They penetrate through the polysilicon layer 36 and are finally trapped inside the semiconductor substrate 30. The second ion implantation forms a common source region 40. Thereafter, the photoresist layer 39 is removed.

Figure 3H:
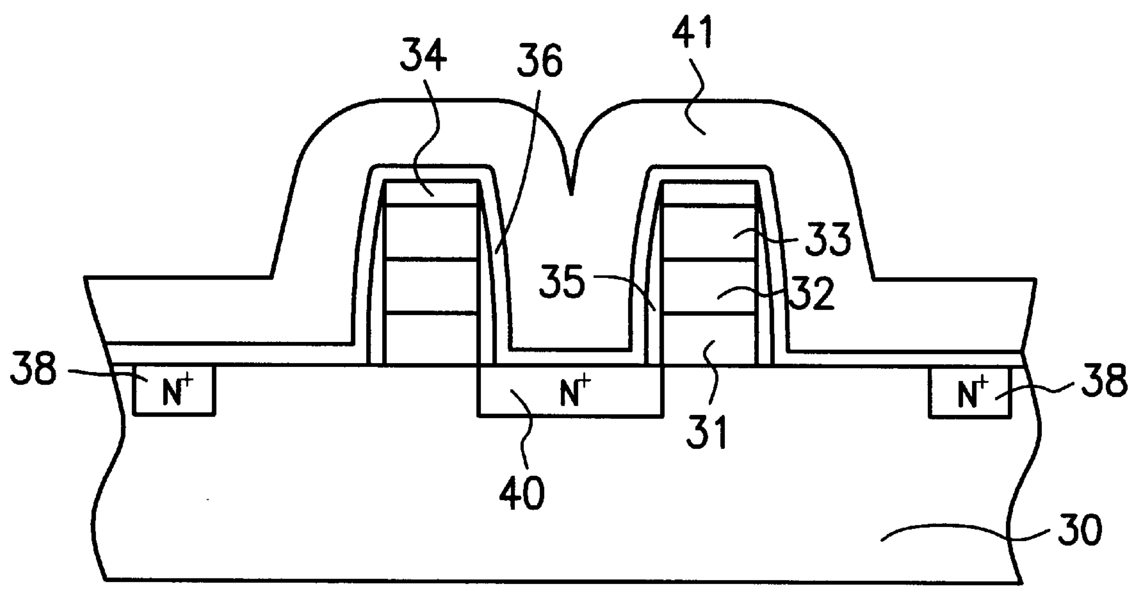

Finally, as shown in FIG. 3H, a third conductive layer 41 is formed over the polysilicon layer 36 and then patterned to form a split-gate flash memory cell structure. The third conductive layer 41 can be assembled from a layer of second polysilicon layer and a layer of tungsten silicide, which, together with the polysilicon layer 36, constitute a split-gate layer.

In this embodiment, the ions are implanted to form the drain region in a self-aligned process using the second spacers act as a mask. This eliminates one doping operation using a photoresist mask and thus fabrication is somewhat simplified. Furthermore, ion doping for the source region and the drain region are carried out separately in a first and a second ion implantation; hence, the quantity of ions doped can be separately controlled, and so parameters for the flash memory can be easily and independently adjusted. Moreover, the second spacers can be used to control the tunneling length of the channel, and the polysilicon layer underneath the second spacers can act as a protective layer for the split-gate channel, thereby maintaining proper memory function and high stability. In addition, the polysilicon layer is itself conductive, and so can be combined with the conductive layer to form the select gate.

In one aspect, this invention provides a method for forming a split-gate flash memory cell structure such that the drain region is formed by implanting ions into the semiconductor substrate using the second spacers as a mask. Hence, there is no need for coating the structure with a photoresist layer or other masking layer before carrying out the ion implantation process.

In another aspect, this invention provides a method for forming a split-gate flash memory cell structure that uses the second spacers as a mask in carrying out the implantation of ions to form a drain region. The channel length of the split-gate can be controlled and thus functionality of a flash memory cell can be maintained.

In yet another aspect, this invention provides a method for forming a split-gate flash memory cell structure that uses the polysilicon layer as a protective layer for protecting the channel region during the process of second spacer formation and ion implantation. Therefore, the functionality of a flash memory cell is maintained.

In a fourth aspect, this invention provides a method for forming a split-gate flash memory cell structure whose ion implantation processes for forming the source and the drain region are separate. Hence, the quantity of ions doped into the source and the drain region can be separately controlled, and so the operating parameters of the source region and the drain region can be adjusted independently.

It will be apparent to those skilled in the art that the structure of the present invention can be modified and varied in many ways without departing from the scope or spirit of the invention. In view of the foregoing, it is intended that the present invention cover modifications and variations of this invention provided they fall within the scope of the following claims and their equivalents.

What is claimed is:

1. A method for manufacturing a split-gate flash memory cell comprising:

providing a semiconductor substrate having at least one multi-layer gate structure formed thereon, wherein the multi-layer gate structure includes a first conductive layer, a dielectric layer, a second conductive layer and a silicon nitride layer;

forming a first spacer around the sides of the multi-layer gate structure;

forming a polysilicon layer over the multi-layer gate structure and above the semiconductor substrate;

forming a second spacer around the sides of the polysilicon layer;

using the second spacer as a mask, performing a first ion implantation implanting ions into the semiconductor substrate to form a drain region;

removing the second spacer to expose the polysilicon layer;

forming a mask over the polysilicon layer, and then performing a second ion implantation implanting ions into the semiconductor substrate to form a source region; and forming a third conductive layer over the semiconductor substrate and the multi-layer gate structure.

2. The method of claim 1, wherein the step of forming the multi-layer gate structure includes the steps of:

forming a gate oxide layer over the semiconductor substrate;

forming a first conductive layer over the gate oxide layer to act as a floating gate;

forming a dielectric layer over the first conductive layer;

forming a second conductive layer over the dielectric layer to act as a control gate;

forming a silicon nitride layer over the second conductive layer; and patterning with a mask to remove a portion of the silicon nitride layer, the second conductive layer, the dielectric layer, the first conductive layer and the gate oxide layer to expose a portion of the semiconductor substrate, thereby forming the multi-layer gate structure.

3. The method of claim 2, wherein the step of forming the dielectric layer includes depositing an oxide layer, a silicon nitride layer and an oxide layer in sequence to form an oxide/nitride/oxide composite structure.

4. The method of claim 1, wherein the step of forming the first spacer includes the steps of:

forming an oxide layer over the multi-layer gate structure and above the semiconductor substrate; and etching the oxide layer to form a first spacer.

5. The method of claim 1, wherein the polysilicon layer has a thickness of about 200 Å to 500 Å.

6. The method of claim 1, wherein the step of forming the second spacer includes the steps of:

forming an oxide layer over the polysilicon layer; and etching the oxide layer to form a second spacer.

7. The method of claim 6, wherein the step of etching the oxide layer includes an anisotropic etching back method.

8. The method of claim 6, wherein the oxide layer has a thickness of about 2000 Å to 4000 Å.

9. The method of claim 6, wherein the step of forming the oxide layer includes using tetra-ethyl-ortho-silicate.

10. The method of claim 6, wherein the step of forming the oxide layer includes a plasma-enhanced chemical vapor deposition method.

11. The method of claim 1, wherein the step of forming the source region further includes the steps of:

forming a photoresist layer over the polysilicon layer;

patterning with a mask to expose an area for forming the desired source region;

implanting ions into the exposed area to form a source region in the semiconductor substrate; and removing the photoresist layer.

12. The method of claim 1, wherein the step of forming the third conductive layer includes depositing a second polysilicon layer followed by a tungsten silicide layer.

13. A method for manufacturing a split-gate flash memory cell comprising the steps of:

providing a semiconductor substrate having at least one multi-layer gate structure formed thereon, wherein the multi-layer gate structure includes a first conductive layer, a dielectric layer, a second conductive layer and a silicon nitride layer;

forming a first spacer around the sides of the multi-layer gate structure;

forming a first polysilicon layer over the multi-layer gate structure and above the semiconductor substrate;

forming an oxide layer over the first polysilicon layer;

etching back to remove a portion of the oxide layer and forming a second spacer around the sides of the first polysilicon layer;

using the second spacer as a mask, performing a first ion implantation implanting ions into the semiconductor substrate to form a drain region;

removing the second spacer;

forming a photoresist layer over the first polysilicon layer;

forming a mask to expose an area for forming the source region; implanting ions into the exposed area to form a source region in the semiconductor substrate;

removing the photoresist layer;

forming a second polysilicon layer over the first polysilicon layer; and forming a tungsten silicide layer over the second polysilicon layer.

14. The method of claim 13, wherein the first polysilicon layer has a thickness of about 200 Å to 500 Å.

15. The method of claim 14, wherein the step of forming the dielectric layer includes depositing an oxide layer, a silicon nitride layer and an oxide layer in sequence to form an oxide/nitride/oxide composite structure.

16. The method of claim 14, wherein the step of etching a portion of the oxide layer includes an anisotropic etching back method.

17. The method of claim 14, wherein the oxide layer has a thickness of about 2000 Å to 4000 Å.

18. The method of claim 14, wherein the step of forming the oxide layer includes using tetra-ethyl-ortho-silicate.

19. The method of claim 14, wherein the step of forming the oxide layer includes a plasma-enchanced chemical vapor deposition method.

* * * * *